United States Patent
Ohsaki

(10) Patent No.: US 7,148,956 B2
(45) Date of Patent: *Dec. 12, 2006

(54) EXPOSURE METHOD

(75) Inventor: Yoshinori Ohsaki, Tochigi (JP)

(73) Assignee: Canon Kabushiki Kaisha, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 11/433,402

(22) Filed: May 15, 2006

(65) Prior Publication Data

US 2006/0203219 A1 Sep. 14, 2006

Related U.S. Application Data

(63) Continuation of application No. 10/797,218, filed on Mar. 9, 2004, now Pat. No. 7,046,333.

(30) Foreign Application Priority Data

Mar. 10, 2003 (JP) ............................ 2003-064106

(51) Int. Cl.
*G03B 27/42* (2006.01)
*G03B 27/52* (2006.01)

(52) U.S. Cl. ........................................ 355/53; 355/55

(58) Field of Classification Search ................. 355/52, 355/53, 55, 67; 250/548; 356/399–401; 430/22, 311

See application file for complete search history.

(56) References Cited

U.S. PATENT DOCUMENTS

| | | | | |
|---|---|---|---|---|
| 5,309,197 | A * | 5/1994 | Mori et al. | 355/53 |
| 5,448,332 | A * | 9/1995 | Sakakibara et al. | 355/53 |
| 5,602,399 | A * | 2/1997 | Mizutani | 250/548 |
| 5,783,833 | A * | 7/1998 | Sugaya et al. | 250/548 |
| 6,281,966 | B1 * | 8/2001 | Kenmoku | 355/55 |
| 6,522,386 | B1 * | 2/2003 | Nishi | 355/52 |
| 6,559,465 | B1 * | 5/2003 | Yamada et al. | 250/559.29 |
| 6,744,512 | B1 * | 6/2004 | Takahashi | 356/401 |
| 6,813,000 | B1 * | 11/2004 | Nishi | 355/53 |
| 7,046,333 | B1 * | 5/2006 | Ohsaki | 355/53 |

* cited by examiner

*Primary Examiner*—Henry Hung Nguyen
(74) *Attorney, Agent, or Firm*—Morgan & Finnegan LLP

(57) ABSTRACT

Disclosed is an exposure method in which high precision focus calibration is realized by measuring a tilt of an image plane in a scanning direction, so that exposure with a high resolution can be performed. The exposure method includes: a measuring step of measuring a position of an image plane of a projection optical system at a plurality of measurement positions different from each other with respect to a scanning direction; and a correcting step of correcting a tilt of the image plane of the projection optical system based on measurements.

11 Claims, 11 Drawing Sheets

EXPOSURE METHOD

This application is a continuation application of U.S. patent application Ser. No. 10/797,218 filed on Mar. 9, 2004 now U.S. Pat. No. 7,046,333, which is herein incorporated by reference.

BACKGROUND OF THE INVENTION

1. Field of the Invention

The present invention generally relates to an exposure method, and more particularly to an exposure method used to exposure a substrate to be processed, such as a single crystalline substrate for a semiconductor wafer. The present invention is suitable to, for example, an exposure method of exposing a single crystalline substrate for a semiconductor wafer by a step-and-scan method in a photolithographic process.

2. Related Background Art

Up to now, there has been used a projection exposure apparatus for projecting a circuit pattern drawn on a reticle or a mask (these terms are interchangeably used in the present application) to a wafer or the like by a projection optical system to transfer the circuit pattern when a minute semiconductor device such as a semiconductor memory or a logic circuit is produced using a photolithographic (printing) technique. Among the projection exposure apparatuses, a scanning exposure apparatus that exposes the entire reticle pattern to each region to be exposed of the wafer by scanning the reticle and the wafer in synchronous with each other while a portion of the reticle is illuminated (which is also called a "scanner") in order to improve resolution and to expand an exposure region, recently attracts lots of attention. The scanning exposure apparatus typically includes a reticle stage and a wafer stage, which are used for scanning the reticle and the wafer between which the projection optical system is interposed.

In the scanning exposure apparatus, a focus detection system is constructed as a focal position detecting unit that measures a displacement in position of the wafer in the optical axis direction of the projection optical system (that is, a displacement between the focal plane of the projection optical system and the wafer surface).

However, when the projection optical system absorbs exposure heat or when a surrounding environment varies, an error is caused between a measurement origin of the focus detection system and the focal plane of the projection optical system. Therefore, in order to measure the error for the correction, a through-the-reticle (TTR) alignment optical system is constructed.

Also, the TTR alignment optical system is generally composed of two optical systems. Therefore, it is possible to simultaneously perform focal measurement at two points. FIG. 13 is a schematic view showing a drive area of a conventional TTR alignment optical system. As shown in FIG. 13, on the proviso that a scanning direction is set to a Y-axis direction, the TTR alignment optical system is constructed such that the first optical system and the second optical system can be driven within drive areas MEa and MEb on an X-axis with a Y-axis set as a symmetry axis in a slit-shaped exposure slit ES in which a direction perpendicular to the scanning direction is a long side and the scanning direction is a short side.

The reason why the first optical system and the second optical system are disposed symmetrically about the Y-axis on the X-axis is to measure a tilt of an image plane in the X-axis direction. Even in the case where the focal measurement is performed on only one point by the TTR alignment optical system and the focus calibration with the focus detection system is performed, when an actual image plane of the projection optical system and an actual exposure surface (printing surface) are tilted, a preferable resolution performance can be obtained on the entire exposure slit ES. In particular, in the case of the scanning exposure apparatus, the exposure region at rest is in a slit shape. Therefore, when the image plane of the projection optical system and the actual exposure surface (that is, the wafer surface) in a direction perpendicular to the scanning direction (long side direction) are tilted, the resolution is lowered.

Thus, for example, as shown in FIG. 13, a focusing condition of the projection optical system is measured at each of a plurality of measurement points KP in the exposure slit ES. Then, the tilt of the image plane in the X-axis direction is obtained and the actual exposure surface is aligned with the image plane based on the obtained tilt, with the result that the preferable resolution performance cannot be obtained.

A reduction in size of a pattern to be transferred, that is, an increase in resolution is required according to an increase in scale of integration of the semiconductor devices. In order to satisfy such requirements, only a reduction in exposure wavelength has been performed up to now. However, the scale of integration of the semiconductor devices is rapidly increasing and it is difficult to cope with this only through the reduction in exposure wavelength. Therefore, in recent years, in order to satisfy the requirement for the increase in resolution, in addition to the reduction in exposure wavelength, a numerical aperture (NA) of the projection optical system is increased from a conventional NA of about 0.6 to a high NA which exceeds 0.8.

Thus, the focal depth becomes extremely smaller than conventional ones. In the exposure apparatus, a significant improvement in detection precision of the focal position, in particular, an improvement in precision with respect to the focus calibration is required. In particular, because of a decrease in focal depth, the following are required as indispensable operations. That is, the tilt of the image plane in the scanning direction, in which a problem is not caused up to now is measured. Then, for example, the actual exposure surface is aligned with the image plane of the projection optical system by driving the wafer stage. Alternatively, the image plane is corrected by driving a lens and the like in the projection optical system, so that it is aligned with the actual exposure surface.

As shown in FIG. 13, in the conventional scanning exposure apparatus, the first optical system and the second optical system which compose the TTR alignment optical system are provided in the exposure slit ES. The focal measurement is performed on the heights of two images in the exposure slit ES symmetrical about the Y-axis. Therefore, according to the conventional scanning exposure apparatus, the tilt of the image plane in the direction perpendicular to the scanning direction can be measured and corrected. However, the tilt of the image plane in the scanning direction cannot be measured.

SUMMARY OF THE INVENTION

Therefore, an exemplary object of the present invention is to provide an exposure method in which high precision focus calibration is realized by measuring a tilt of an image plane in a scanning direction, so that exposure with a high resolution can be performed.

In order to achieve the above-mentioned object, according to an aspect of the present invention, an exposure method of exposing a predetermined pattern formed on a reticle to a substrate through a projection optical system while the reticle and the substrate are scanned in synchronous with each other, includes: a measuring step of measuring a position of an image plane of the projection optical system at a plurality of measurement positions different from each other with respect to a direction in which the reticle and the substrate are scanned; and a correcting step of correcting a tilt of the image plane of the projection optical system based on measurements obtained by the measuring step.

Further objects of the present invention and other features of the present invention will be apparent from a preferred embodiment described below with reference to the accompanying drawings.

DESCRIPTION OF THE PREFERRED EMBODIMENTS

Figure 1:
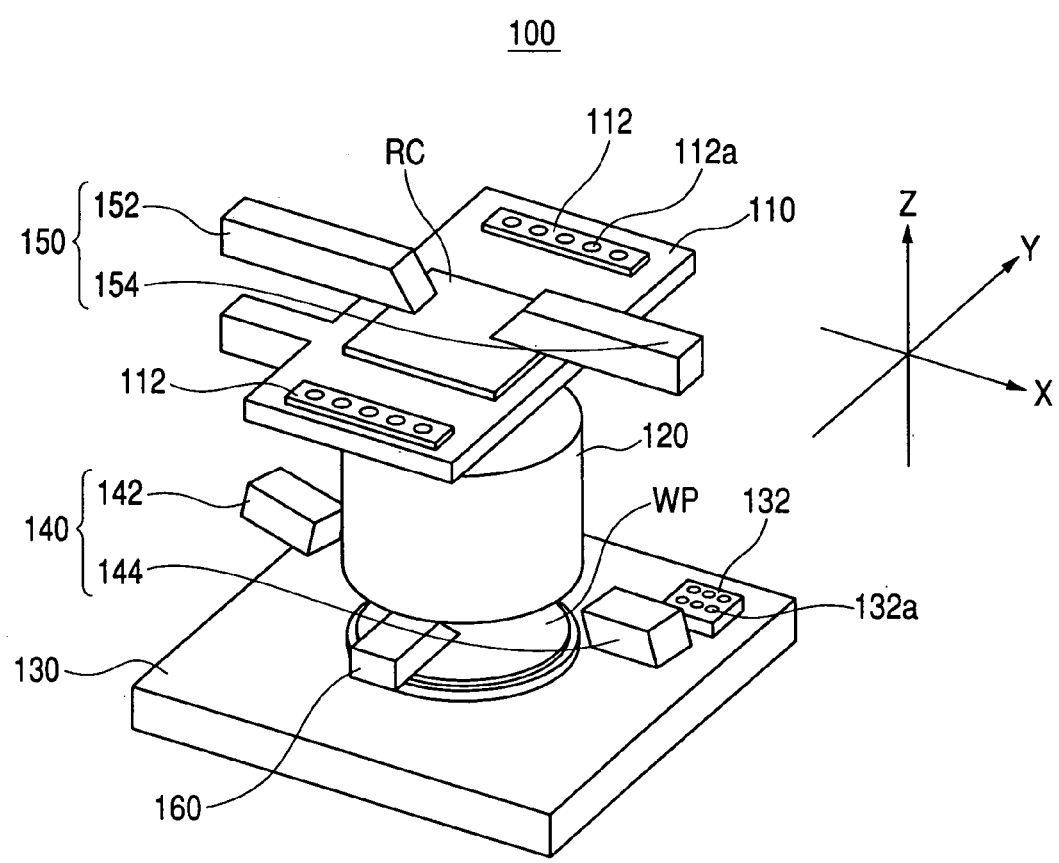
FIG. 1 is a schematic structural view showing an exemplary structure of an exposure apparatus according to an aspect of the present invention.

Hereinafter, an exposure method and an exposure apparatus according to an aspect of the present invention will be described with reference to the accompanying drawings. Note that the same references are provided to the same members throughout the drawings and the repetitive description is omitted here. FIG. 1 is a schematic structural view showing an exemplary structure of an exposure apparatus 100 according to an aspect of the present invention. Note that an illumination apparatus that illuminates a reticle RC on which a circuit pattern is formed is omitted in FIG. 1.

As shown in FIG. 1, the exposure apparatus 100 is a scanning projection exposure apparatus that exposes the circuit pattern formed on the reticle RC to a wafer WP by a step-and-scan method. The exposure apparatus 100 includes: a reticle stage 110 on which the reticle RC is mounted; a projection optical system 120; a wafer stage 130 on which the wafer WP is mounted; a focus detection system 140; a TTR alignment optical system 150; and a control unit 160. During the exposure, the reticle RC is illuminated with exposure light emitted from an illumination apparatus which is not shown in the figure by Koehler illumination. Light reflecting a reticle pattern by passing through the reticle RC is imaged onto the wafer WP by the projection optical system 120. Such an exposure apparatus is suitable for a lithographic process of sub-micron, sub-quarter-micron or less thereof.

The reticle RC is made of, for example, quartz and the circuit pattern to be transferred is formed thereon. The reticle RC is held by the reticle stage 110 and moved. The reticle RC and the wafer WP are located at positions optically conjugate with each other through the projection optical system 120. An arc or slit illumination region elongated in the X-axis direction is produced on the reticle RC by the illumination apparatus which is not shown in the figure.

The reticle stage 110 holds the reticle RC and moves the reticle RC in the Y-axis direction shown in FIG. 1. A reticle side reference plate (hereinafter referred to as a "R side reference plate") 112 is fixedly disposed in a predetermined area near the reticle RC on the reticle stage 110 such that a height of the reflective surface (pattern surface) of the R side reference plate 112 is made substantially equal to a height of the reflective surface (pattern surface) of the reticle RC.

Figure 2:
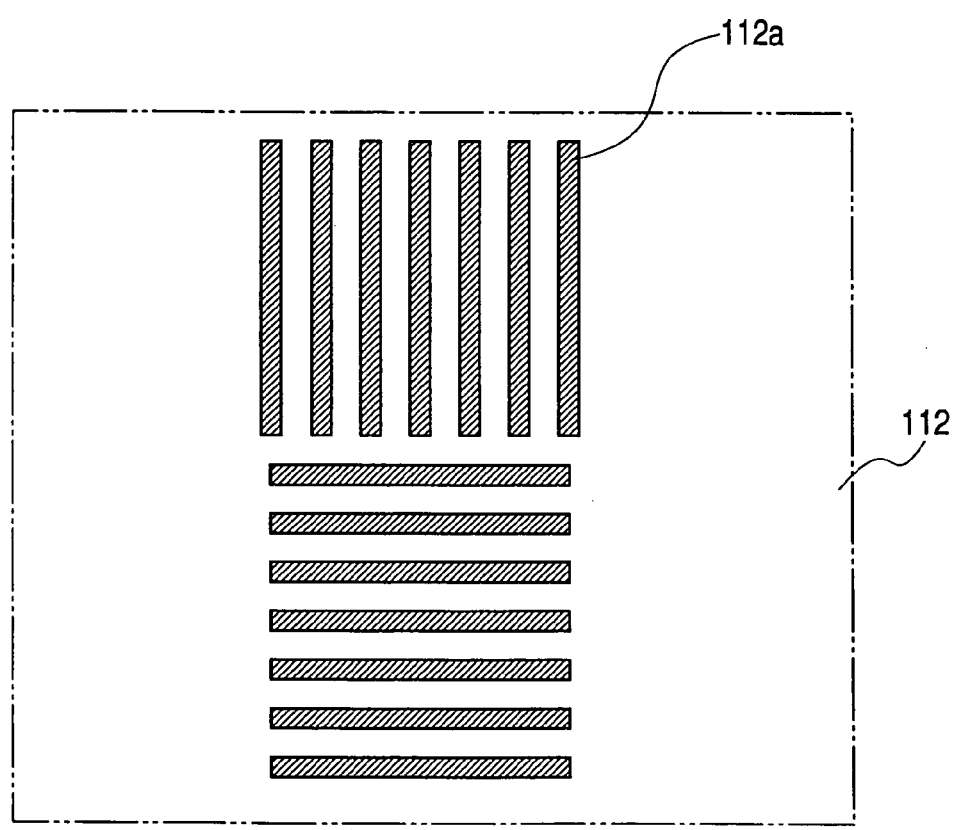
FIG. 2 is a schematic plan view showing an example of an arrangement of focal measurement marks.

A plurality of focal measurement marks 112a made of metal such as Cr or Al are formed on the reflective surface of the R side reference plate 112. As shown in FIG. 2, the focal measurement marks 112a are composed of, for example, a plurality of straight lines extended in the X- and Y-directions. Here, FIG. 2 is a schematic plan view showing an example of an arrangement of the focal measurement marks 112a.

An optical system that projects the circuit pattern formed on the reticle RC to the wafer WP and which is composed only of a plurality of lens elements, an optical system including a plurality of lens elements and at least one concave mirror (catadioptric optical system), an optical system including a plurality of lens elements and at least one diffraction optical element such as a kinoform, an all-mirror type optical system, or the like can be used as the projection optical system 120. When it is necessary to correct a chromatic aberration, the plurality of lens elements which have dispersion values (Abbe values) different from each other and are made of glass are used. Alternatively, the diffraction optical element and the lens elements are disposed so as to cause reverse dispersion.

The wafer WP is a substrate to be processed and broadly includes a liquid crystal substrate or other such substrates. A photo resist is applied to the wafer WP.

The wafer stage 130 holds the wafer WP and moves the wafer WP in the X-, Y-, and Z-axis directions shown in FIG. 1. A wafer side reference plate (hereinafter referred to as a "W side reference plate") 132 is fixedly disposed in a predetermined area near the wafer WP on the wafer stage 130 such that a height of the reflective surface of the W side reference plate 132 is made substantially equal to a height of the top surface of the wafer WP (that is, an imaging plane of the projection optical system 120). A plurality of focal measurement marks 132a made of metal such as Cr or Al are formed on the reflective surface of the W side reference plate 132. Note that the focal measurement marks 132a are identical to the focal measurement marks 112a and thus the detailed description is omitted here.

A position of the reticle stage 110 and a position of the wafer stage 130 are monitored by, for example, a laser interferometer. The reticle stage 110 and the wafer stage 130 are driven at a speed ratio corresponding to an optical magnification of the projection optical system 120.

The focus detection system 140 is an oblique-incidence type focal position detecting unit and includes: an irradiation section 142 that irradiates the surface of the wafer WP (or the W side reference plate 132) to which the pattern on the reticle RC is transferred, with nonexposure light in an oblique direction; and a detection section 144 that detects reflection light fluxes obliquely reflected on the surface of the wafer WP (or the W side reference plate 132).

The detection section 144 includes a plurality of light receiving elements for position detection which are provided corresponding to the respective reflection light fluxes and disposed such that the light receiving surfaces of the light receiving elements become substantially conjugate with reflection points of the respective reflection light fluxes on the wafer WP. Therefore, a displacement of position of the wafer WP (or the W side reference plate 132) in the optical axis direction of the projection optical system 120 is measured as a displacement of position on each of the light receiving elements of the detection section 144.

The TTR alignment optical system 150 includes two optical systems of a first optical system 152 and a second optical system 154 and measures an error between the measurement origin of the focus detection system 140 and the focal plane of the projection optical system 120.

Figure 3:
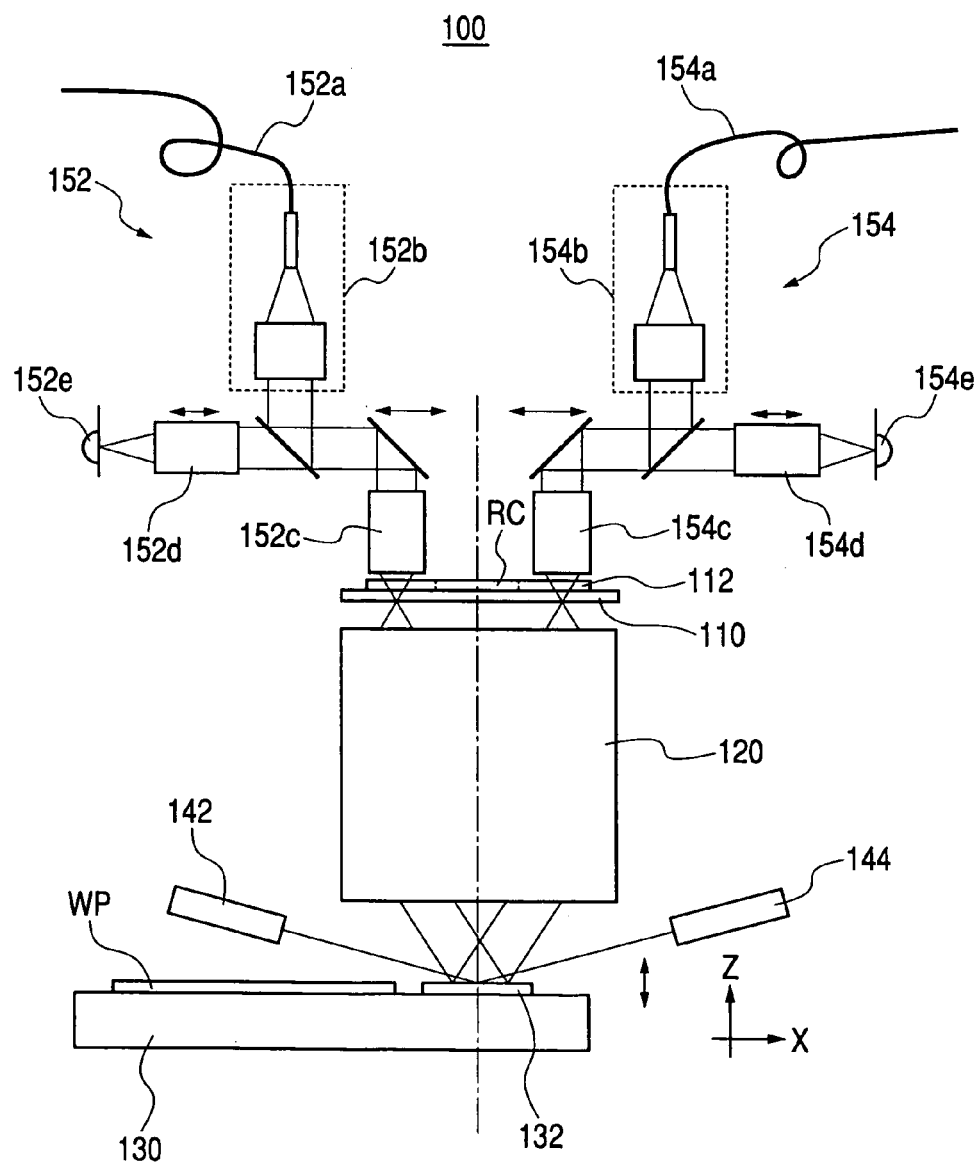
FIG. 3 is a schematic cross sectional view showing an exemplary structure of a TTR alignment optical system.

As shown in FIG. 3, the first optical system 152 includes a fiber 152a, an illumination section 152b, an objective lens 152c, a relay lens 152d, and a sensor 152e. The second optical system 154 includes a fiber 154a, an illumination section 154b, an objective lens 154c, a relay lens 154d, and a sensor 154e. The first optical system 152 can magnify the pattern on the reticle RC or the R side reference plate 112 to image the magnified pattern onto the sensor 152e. The second optical system 154 can magnify the pattern to image the magnified pattern on the sensor 154e. In addition, similarly, the first optical system 152 can image the pattern on the wafer WP or the W side reference plate 132 onto the sensor 152e through the projection optical system 120. The second optical system 154 can image the pattern on the wafer WP or the W side reference plate 132 onto the sensor 154e through the projection optical system 120. Here, FIG. 3 is a schematic cross sectional view showing an exemplary structure of the exposure apparatus 100 according to the aspect of the present invention.

The control unit 160 is connected with the reticle stage 110, the wafer stage 130, the focus detection system 140, and the TTR alignment optical system 150 and controls the operation of the exposure apparatus 100. The control unit 160 determines the tilts of the image plane of the projection optical system 120 in the direction parallel to the scanning direction and the direction perpendicular to the scanning direction from measurements obtained through the detection by the TTR alignment optical system 150 and then controls at least one of the position of the wafer WP and the image plane of the projection optical system 120 based on the determined tilts of the image plane.

Here, a method of measuring the error between the measurement origin of the oblique-incidence type focus detection system 140 and the focal plane of the projection optical system 120 using the TTR alignment optical system 150 will be described in detail. First, light from a light source, which is substantially identical to the exposure light source is guided to the illumination sections 152b and 154b using the fibers 152a and 154a, optical systems (not shown), and the like. Note that the light source is a light source that emits light having a wavelength substantially equal to a wavelength of the exposure light and it is preferable that a difference with the wavelength of the exposure light is 2 nm or smaller. The focal measurement marks 112a on the R side reference plate 112 are illuminated with the light through the objective lenses 152c and 154c. Next, the relay lenses 152d and 154d, the objective lenses 152c and 154c, or the like are driven in the optical axis direction of the TTR alignment optical system 150 so as to obtain a conjugate relationship between the sensors 152e and 154e and the R side reference plate 112.

Next, the wafer stage 130 is driven so as to obtain a state in which the focal measurement marks 132a on the W side reference plate 132 can be illuminated and detected by the TTR alignment optical system 150 through the projection optical system 120. Then, while the position of the W side reference plate 132 in the optical axis direction of the projection optical system 120 is measured by the focus detection system 140, the wafer stage 130 is driven in the optical axis direction (Z-axis direction) and a position in which a conjugate relationship is obtained between the sensors 152e and 154e and the W side reference plate 132 is detected.

At this time, because the conjugate relationship is obtained between the sensors 152e and 154e of the TTR alignment optical system 150 and the R side reference plate 112, a conjugate relationship is obtained between the W side reference plate 132 and the R side reference plate 112. That is, the projection optical system 120 is in a focusing condition. Reading a measurement value of the focus detection system 120 in the focusing condition enables correction of the error between the measurement origin of the focus detection system 140 and the focal plane of the projection optical system 120 (focus calibration).

Figure 13:
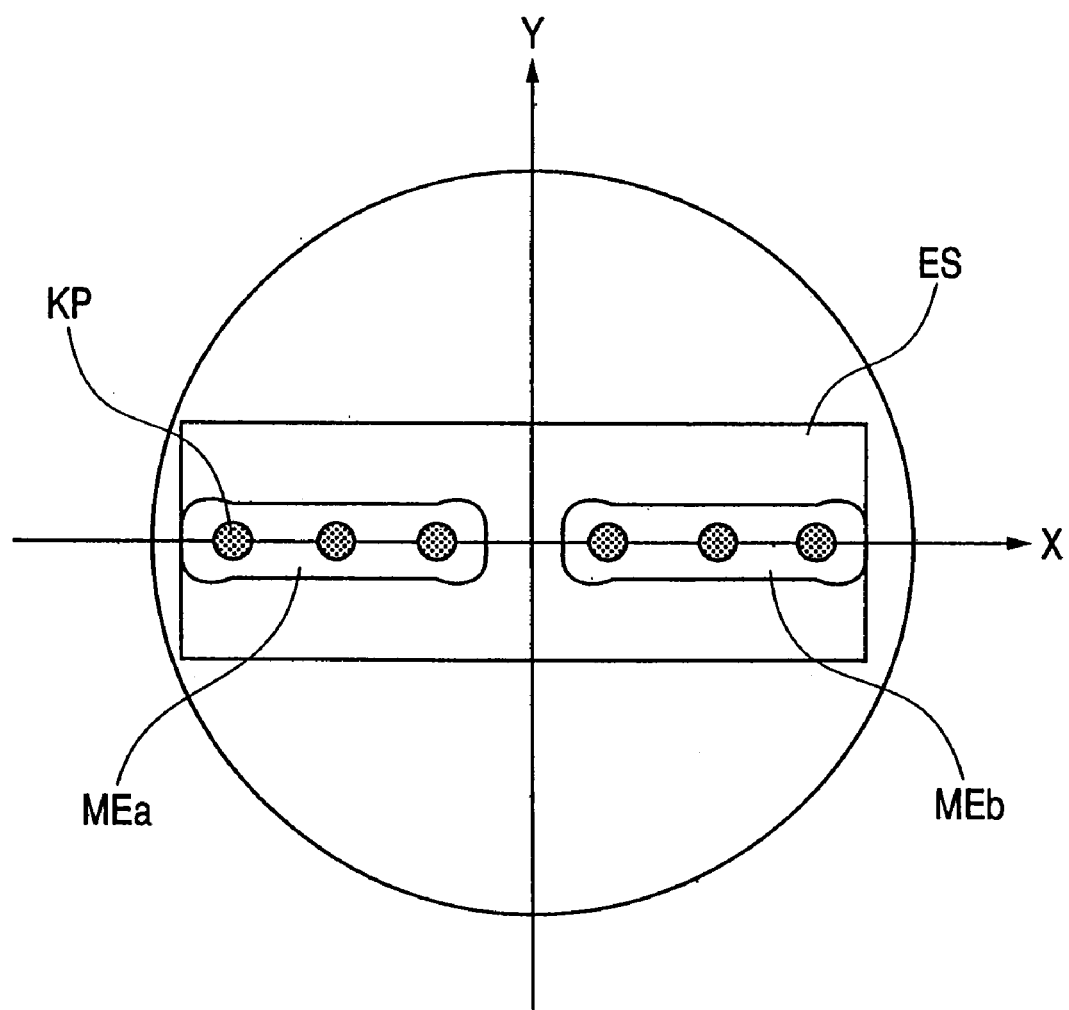
FIG. 13 is a schematic view showing drive areas of a conventional TTR alignment optical system.

As described above, in a conventional scanning exposure apparatus, the TTR alignment optical system is composed of two optical systems provided in the exposure slit. As shown in FIG. 13, the two optical systems are constructed such that they can be driven in the X-direction perpendicular to the scanning direction. The focus calibration is performed at the plurality of positions whose coordinates in the Y-axis direction are the same and only coordinates in the X-axis direction are different from each other. Therefore, the tilt of the image plane in the scanning direction cannot be measured.

Figure 4:
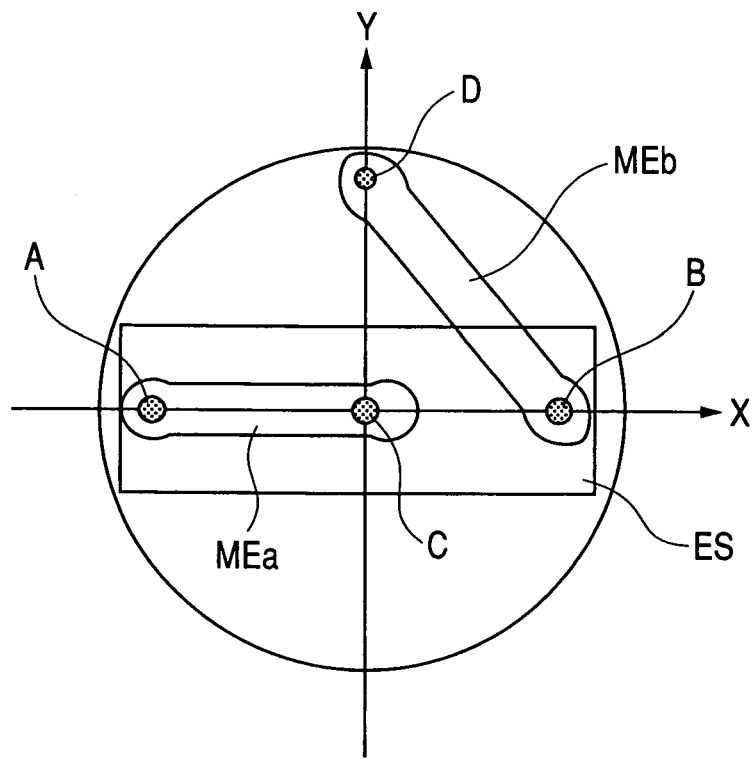
FIG. 4 is a schematic view showing an example of drive areas of the TTR alignment optical system shown in FIG. 3.

Thus, as shown in FIG. 4, the TTR alignment optical system 150 is constructed such that the first optical system 152 can be driven within a drive area MEa parallel to the X-axis and the second optical system 154 can be driven within a drive area MEb which is not parallel to the X-axis and the Y-axis and includes an area located outside an exposure slit ES. With the above structures, the tilt of the image plane in the scanning direction can be measured in addition to the tilt of the image plane in the direction perpendicular to the scanning direction (in X-axis direction), which can be measured up to now. Here, FIG. 4 is a schematic view showing drive areas of the TTR alignment optical system 150 shown in FIG. 1. When the position of the image plane of the projection optical system is measured outside the exposure slit ES in the scanning direction, the tilt of the image plane in the scanning direction can be measured with higher precision.

First, with regard to the measurement of the image plane in the X-axis direction, when the focusing condition of the projection optical system 120 is measured at a measurement point A by the first optical system 152 and the focusing condition thereof is measured at a measurement point B by the second optical system 154, the tilt of the image plane in the X-axis direction can be measured.

Next, the TTR alignment optical system 150 is driven such that the focusing condition can be measured at a measurement point C (on the axis of the projection optical system 120) by the first optical system 152 and the focusing condition can be measured at a measurement point D by the second optical system 154. Then, when the focusing conditions of the projection optical system 120 are measured at the measurement point C and the measurement point D, the tilt of the image plane in the Y-axis direction can be measured. In addition, a curvature of the image plane within the exposure slit ES in the X-axis direction can be calculated from measurements of the focusing conditions of the projection optical system 120 at three points of the measurement point A, the measurement point B, and the measurement point C.

Of the two optical systems of the TTR alignment optical system 150, the first optical system 152 is disposed such that it can be driven parallel to the X-axis and the second optical system 154 is disposed such that it can be driven not parallel to the X-axis and the Y-axis. Therefore, the tilt of the image plane in the scanning direction can be measured in addition to the tilt of the exposure image plane in the direction perpendicular to the scanning direction, which can be measured up to now.

Based on the measurements, the control unit 160 drives, for example, the wafer stage 130 to correct the tilts of the image plane in the scanning direction and the direction perpendicular to the scanning direction. In addition, the control unit 160 drives a part of optical elements composing the projection optical system 120 to correct the curvature of the image plane. Therefore, even in the case of an exposure apparatus using a projection optical system having a high NA, scanning exposure can be performed with best focusing. With respect to a manner of driving the optical element composing the projection optical system 120, it is considered that the optical element is driven in the optical axis direction of the projection optical system 120 and/or the optical element is decentered with respect to the optical axis direction of the projection optical system 120 and/or the optical element is tilted with respect to the optical axis direction of the projection optical system 120.

In particular, when the measurement can be made at the measurement points located outside the exposure slit, a span of one of the two optical systems composing the TTR alignment optical system 150 in the Y-axis direction can be lengthened. Therefore, the tilt of the image plane in the scanning direction can be measured with extremely high precision.

Figure 5:
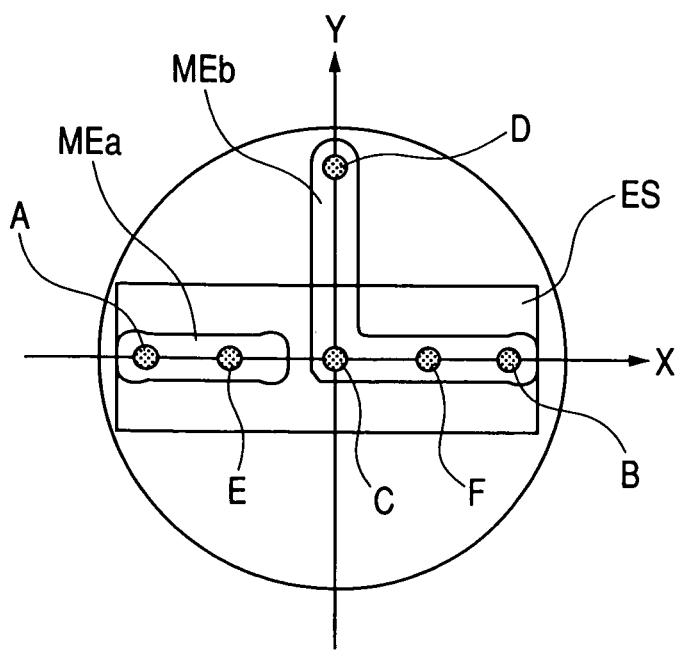
FIG. 5 is a schematic view showing another example of drive areas of the TTR alignment optical system shown in FIG. 3.

Next, a modification of the TTR alignment optical system 150 in which the drive areas are changed will be described with reference to FIG. 5. FIG. 5 is a schematic view showing drive areas of the TTR alignment optical system 150 shown in FIG. 1.

In the case of the drive areas of the TTR alignment optical system 150 as shown in FIG. 4, the tilt of the image plane in the scanning direction can be measured. However, when it is compared with the drive areas of the conventional TTR alignment optical system as shown in FIG. 13, there is the following defect.

As shown in FIG. 13, the drive areas of the conventional TTR alignment optical system are parallel to the X-axis (on the X-axis), so that the focusing conditions of the projection optical system can be measured at arbitrary points on the X-axis within the drive areas. That is, when the focusing condition of the projection optical system is measured at each of a plurality of positions on the X-axis, the image plane in the X-axis direction can be measured in detail.

On the other hand, with respect to the drive areas of the TTR alignment optical system 150 as shown in FIG. 4, because the drive area MEb of the second optical system 154 is not parallel to both the X-axis and the Y-axis, a position (image height) at which measurement can be made on the X-axis is only one point. Therefore, the image plane in the X-axis direction can be measured at only three points of the measurement points A, B, and C, thereby reducing the measurement precision of the image plane in the X-axis direction.

Thus, as shown in FIG. 5, the TTR alignment optical system 150 is constructed such that the second optical system 154 can be driven on the X-axis and the Y-axis within the drive area MEb in which a point on the axis of the projection optical system 120 is used as a vertex in an L-shape formed by the X-axis and the Y-axis and the first optical system 152 can be driven on the X-axis within the drive area MEa. Therefore, as in the case shown in FIG. 4, the tilt of the image plane in the Y-axis direction can be measured from measurements of the focusing conditions of the projection optical system 120 at the measurement point C and the measurement point D. Further, a large number of measurement points can be provided on the X-axis as in a conventional case. For example, when the focusing condition of the projection optical system 120 is measured at each of five points of the measurement point A, the measurement point E, the measurement point C, the measurement point F, and the measurement point B on the X-axis, the image plane in the X-axis direction can be measured with the same precision as in a conventional case.

Figure 6:
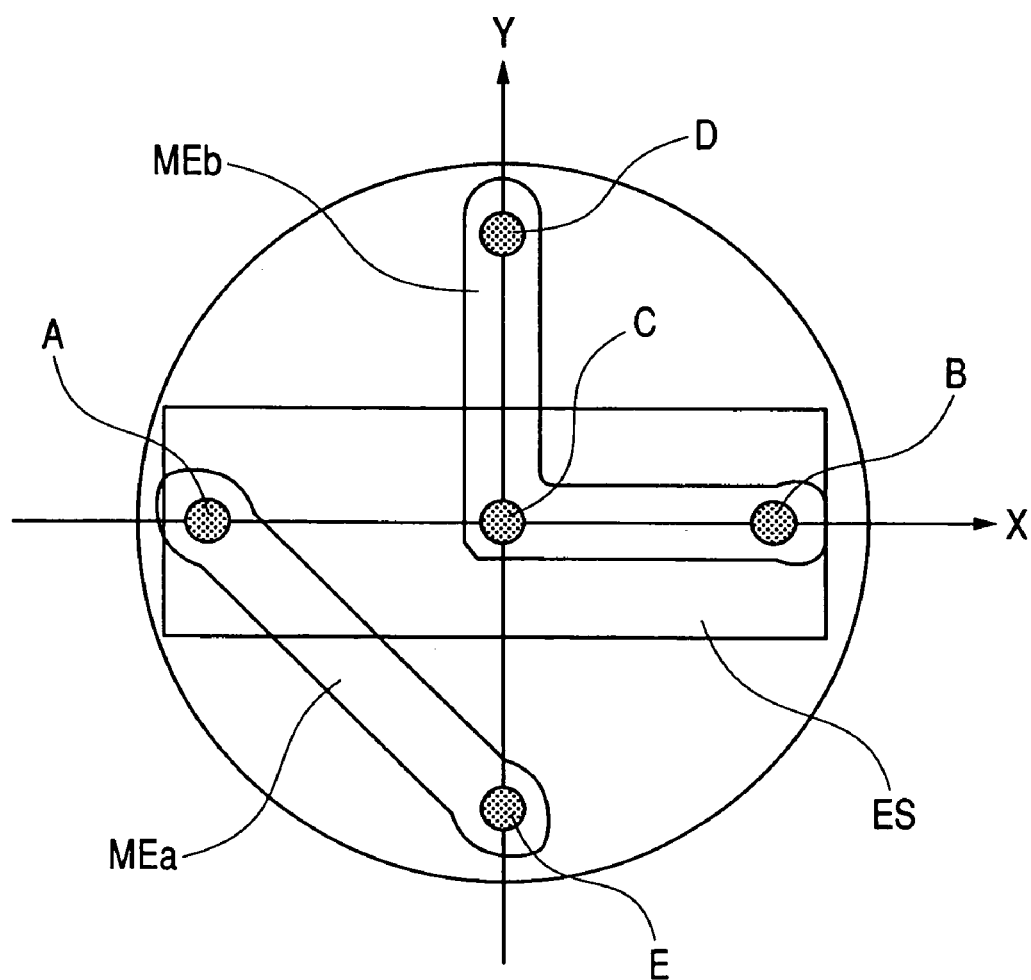
FIG. 6 is a schematic view showing another example of drive areas of the TTR alignment optical system shown in FIG. 3.

Next, a modification of the TTR alignment optical system 150 in which the drive areas are further changed will be described with reference to FIG. 6. FIG. 6 is a schematic view showing drive areas of the TTR alignment optical system 150 shown in FIG. 1.

Referring to FIG. 6, the TTR alignment optical system 150 is constructed such that the first optical system 152 can be driven not parallel to the X-axis and the Y-axis within the drive area MEa and the second optical system 154 can be driven on the X-axis and the Y-axis within the drive area MEb in which a point on the axis of the projection optical system 120 is used as a vertex in an L-shape formed by the X-axis and the Y-axis. In addition, both the first optical system 152 and the second optical system 154 can perform the measurement outside the exposure slit ES.

Therefore, the tilt of the image plane in the X-axis direction can be measured from measurements of the focusing conditions of the projection optical system 120 at the measurement point A, the measurement point B, and the measurement point C. In addition, the tilt of the image plane in the Y-axis direction can be measured from measurements of the focusing conditions of the projection optical system 120 at the measurement point D and the measurement point E. In particular, because the tilt of the image plane in the Y-axis direction is measured using the measurement point D and the measurement point E, a span can be lengthened as compared with drive areas of the TTR alignment optical system 150 as shown in FIGS. 4 and 5, so that the measurement precision can be improved.

Also, the measurement point C on the axis of the projection optical system 120 can be used to measure the image plane in the Y-axis direction. For example, a combination of measurement points used to measure the image plane in the Y-axis direction can be changed to a combination of the measurement point C and the measurement point D, a combination of the measurement point C and the measurement point E, or the like, according to the scanning direction. The exposure apparatus 100 can measure the tilt of the image plane in the scanning direction by the TTR alignment optical system 150, so that high precision focus calibration can be realized. Thus, a device (such as semiconductor device, an LCD device, an image pickup device (such as CCD), or a thin film magnetic head) which has a high throughput, is economically efficient, and has a higher grade than a conventional one can be provided.

Figure 7:
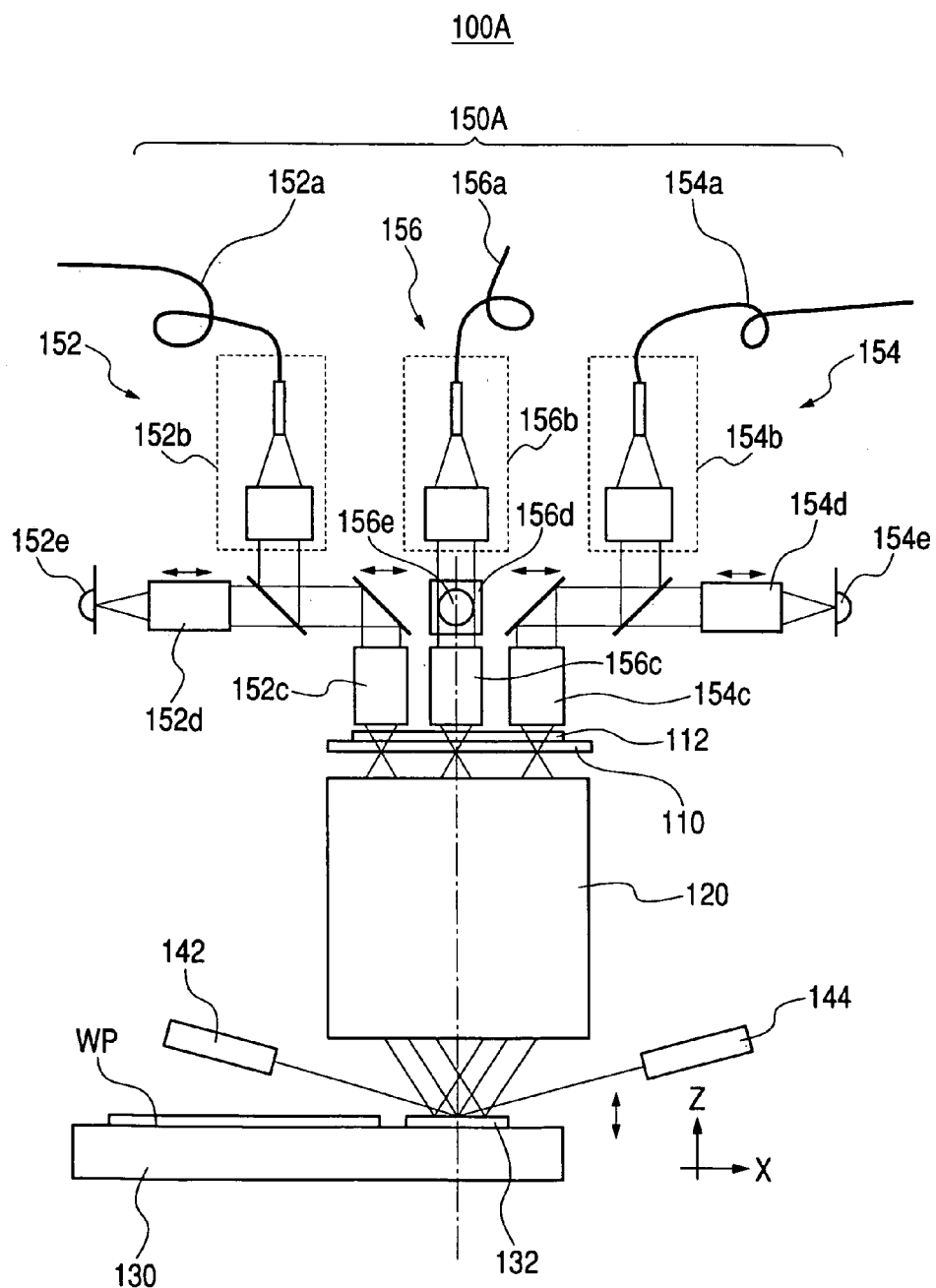
FIG. 7 is a schematic cross sectional view showing an exemplary structure of a TTR alignment optical system.

Hereinafter, an exposure apparatus 100A which is a modified example of the exposure apparatus 100 will be described with reference to FIGS. 7 to 9. FIG. 7 is a schematic cross sectional view showing an exemplary structure of the exposure apparatus 100A according to an aspect of the present invention. Note that an illumination apparatus that illuminates the reticle RC on which a circuit pattern is formed is omitted in FIG. 7. The exposure apparatus 100A is identical to the exposure apparatus 100 shown in FIGS. 1 and 3 except for the structure of a TTR alignment optical system 150A.

The TTR alignment optical system 150A includes three optical systems of the first optical system 152, the second optical system 154, and a third optical system 156, and measures an error between the measurement origin of the focus detection system 140 and the focal plane of the projection optical system 120. As in the cases of the first optical system 152 and the second optical system 154, the third optical system 156 includes a fiber 156a, an illumination section 156b, an objective lens 156c, a relay lens 156d, and a sensor 156e. The third optical system 156 can magnify the pattern on the reticle RC or the R side reference plate 112 to image the magnified pattern onto the sensor 156e. In addition, the third optical system 156 can image the pattern on the wafer WP or the W side reference plate 132 onto the sensor 156e through the projection optical system 120.

Figure 8:
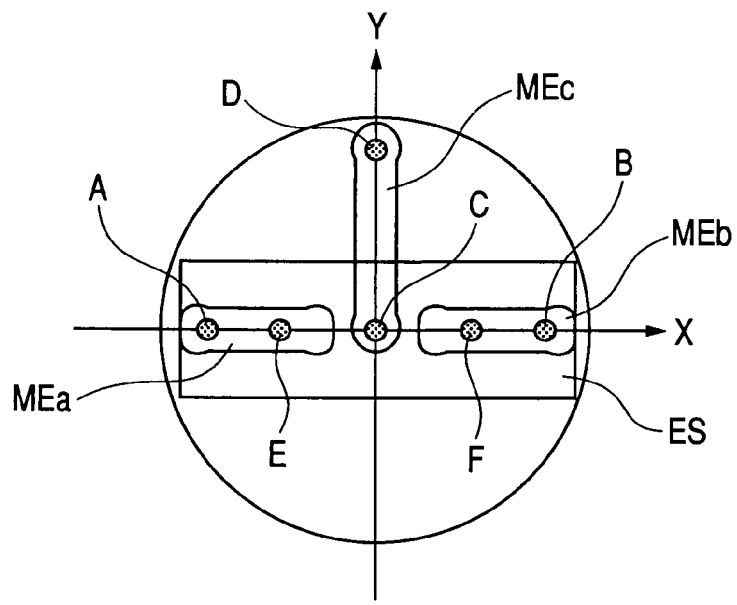
FIG. 8 is a schematic view showing an example of drive areas of the TTR alignment optical system shown in FIG. 7.

As shown in FIG. 8, the TTR alignment optical system 150A is constructed such that the first optical system 152 and the second optical system 154 can be driven within the drive areas MEa and MEb parallel to the X-axis and the third optical system 156 can be driven within the drive area MEc parallel to the Y-axis. FIG. 8 is a schematic view showing the drive areas of the TTR alignment optical system 150A shown in FIG. 7.

According to the structure, the tilt of the image plane in the X-axis direction can be measured using the measurement point A, the measurement point B, the measurement point C, the measurement point E, and the measurement point F. In addition, the tilt of the image plane in the Y-axis direction is measured using the measurement point C and the measurement point D.

Further, the exposure apparatus 100A can simultaneously measure the tilt of the image plane in the X-axis direction and the tilt of the image plane in the Y-axis direction without driving the TTR alignment optical system 150A (driving the first optical system 152, the second optical system 154, and the third optical system 156).

First, the first optical system 152 is located at the measurement point A, the second optical system 154 is located at the measurement point B, and the third optical system 156 is located at the measurement point C. Then, the focusing conditions of the projection optical system 120 are simultaneously measured at the respective measurement points. It is possible to measure the tilt of the image plane in the X-axis direction from measurements of the measurement A and the measurement B, of measurements of the measurement point A, the measurement point B, and the measurement point D. In addition, it is possible to measure the tilt of the image plane in the Y-axis direction from measurements of the measurement point D and an average value of the measurements of the measurement A and the measurement B.

Therefore, when the TTR alignment optical system 150A is composed of the three optical systems and the measurement can be made outside the exposure slit ES in the Y-axis direction by one of the optical systems, both the tilts of the image plane in both the X-axis direction and the Y-axis direction can be simultaneously measured. In addition, in FIG. 8, the third optical system 156 can be driven on the Y-axis direction within the drive region MEc. However, it is also possible that the third optical system 156 is fixedly disposed at only the measurement point D and the tilt of the image plane in the Y-axis direction is measured using the measurement A, the measurement B, and the measurement point D as described above. This case involves a merit in that it is unnecessary to drive the third optical system 156.

Next, a modified example in which the drive areas of the TTR alignment optical system 150A are changed will be described with reference to FIG. 9. FIG. 9 is a schematic view showing the drive areas of the TTR alignment optical system 150A shown in FIG. 7.

Figure 9:
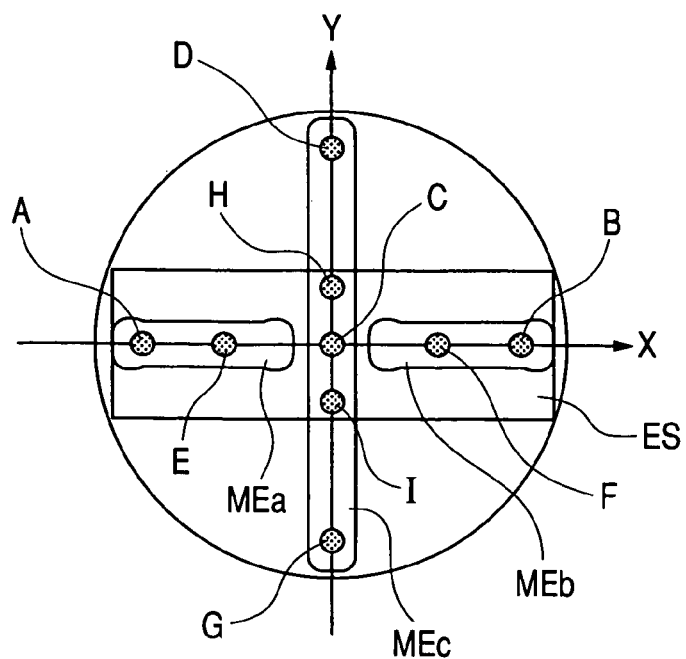
FIG. 9 is a schematic view showing another example of drive areas of the TTR alignment optical system shown in FIG. 7.

Referring to FIG. 9, it is constructed such that the third optical system 156 can be driven in both a plus direction and a minus direction of the Y-axis within the drive area MEc including the axis of the projection optical system 120. Therefore, when the focusing conditions of the projection optical system 120 are measured at the measurement point D and the measurement point G, the tilt of the image plane in the Y-axis direction can be measured with high precision because the span can be lengthened.

The measurement point C on the axis of the projection optical system 120 can be used to measure the tilt of the image plane in the Y-axis direction. For example, a combination of measurement points for measuring the image plane in the Y-axis direction can be changed to a combination of the measurement point C and the measurement point D, a combination of the measurement point C and the measurement point E, or the like, according to the scanning direction. In addition, when an average value of measurements of the measurement point A and the measurement point B is used instead of measurements of the measurement point C, the tilt of the image plane in the Y-axis direction can be measured without driving the third optical system 156.

Further, the tilt of the image plane in the Y-axis direction can be measured using a measurement point H and a measurement point I. In this case, there is a demerit that the span in the Y-axis direction is short. However, because both the measurement point H and the measurement point I are measurement points located within the exposure slit ES, it is effective to measure a change in image plane of the projection optical system 120 in the Y-axis direction due to actual exposure.

Note that, in the above-mentioned exposure apparatuses 100 and 10A, the focal measurement marks 132a on the W side reference plate 132 are illuminated from the TTR alignment optical system 150 or 150A through the projection optical system 120. Therefore, the reflection light from the focal measurement marks 132a passes through the projection optical system 120 two times.

Figure 10:
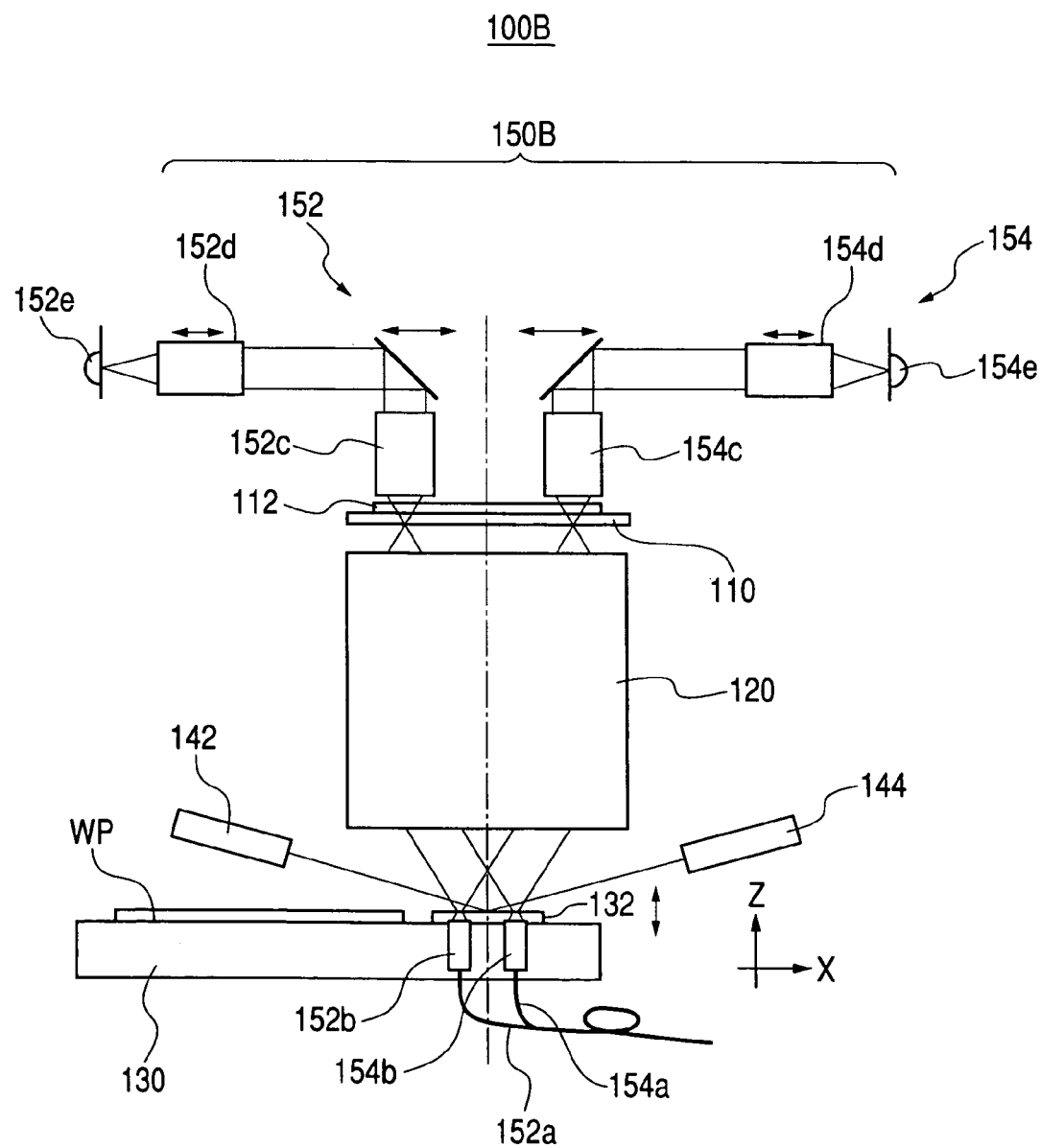
FIG. 10 is a schematic cross sectional view showing an exemplary structure of a TTR alignment optical system.

Here, as shown in FIG. 10, a TTR alignment optical system 150B is constructed so as to illuminate the focal measurement marks 132a on the W side reference plate 132 from the rear side of the W side reference plate 132. When the focal measurement marks 132a are directly illuminated from the rear side of the W side reference plate 132, the reflection light from the focal measurement marks 132a passes through the projection optical system 120 only one time. Thus, in particular, in an exposure apparatus or the like using as a light source an F2 laser in which the transmittance of the projection optical system is low, the focal measurement can be performed by passing light through the projection optical system only one time, so that it is very advantageous in terms of the light amount. FIG. 10 is a schematic cross sectional view showing an exemplary structure of an exposure apparatus 100B which is a modified example of the exposure apparatus 100 or 10A.

Note that, as in the case of the TTR alignment optical system 150, the TTR alignment optical system 150B includes the first optical system 152 and the second optical system 154. The first optical system 152 includes the objective lens 152c, the relay lens 152d, the sensor 152e, and the like. The second optical system 154 includes the objective lens 154c, the relay lens 154d, and the sensor 154e, and the like. A structure in which another optical system is further added may be used. For example, as in the case of the TTR alignment optical system 150A, the third optical system may be added.

Also, when the focusing conditions of the projection optical system 120 are measured, in addition to driving the wafer stage 130 in the Z-direction, a part of the TTR alignment optical system 150B, such as the objective lenses 152c and 154c or the relay lenses 152d and 154d, or the entire TTR alignment optical system 150B can be driven in the optical axis direction to perform the measurement.

The drive areas of the TTR alignment optical system 150B are not limited to the areas shown in FIGS. 4 to 6, and therefore arbitrary drive areas for obtaining the same function can be set. In addition, the focal measurement marks 112a on the R side reference plate 112 and the focal measurement marks 132a on the W side reference plate 132 are not limited to the marks shown in FIG. 2, and therefore another mark structure having the same function may be used.

Figure 11:
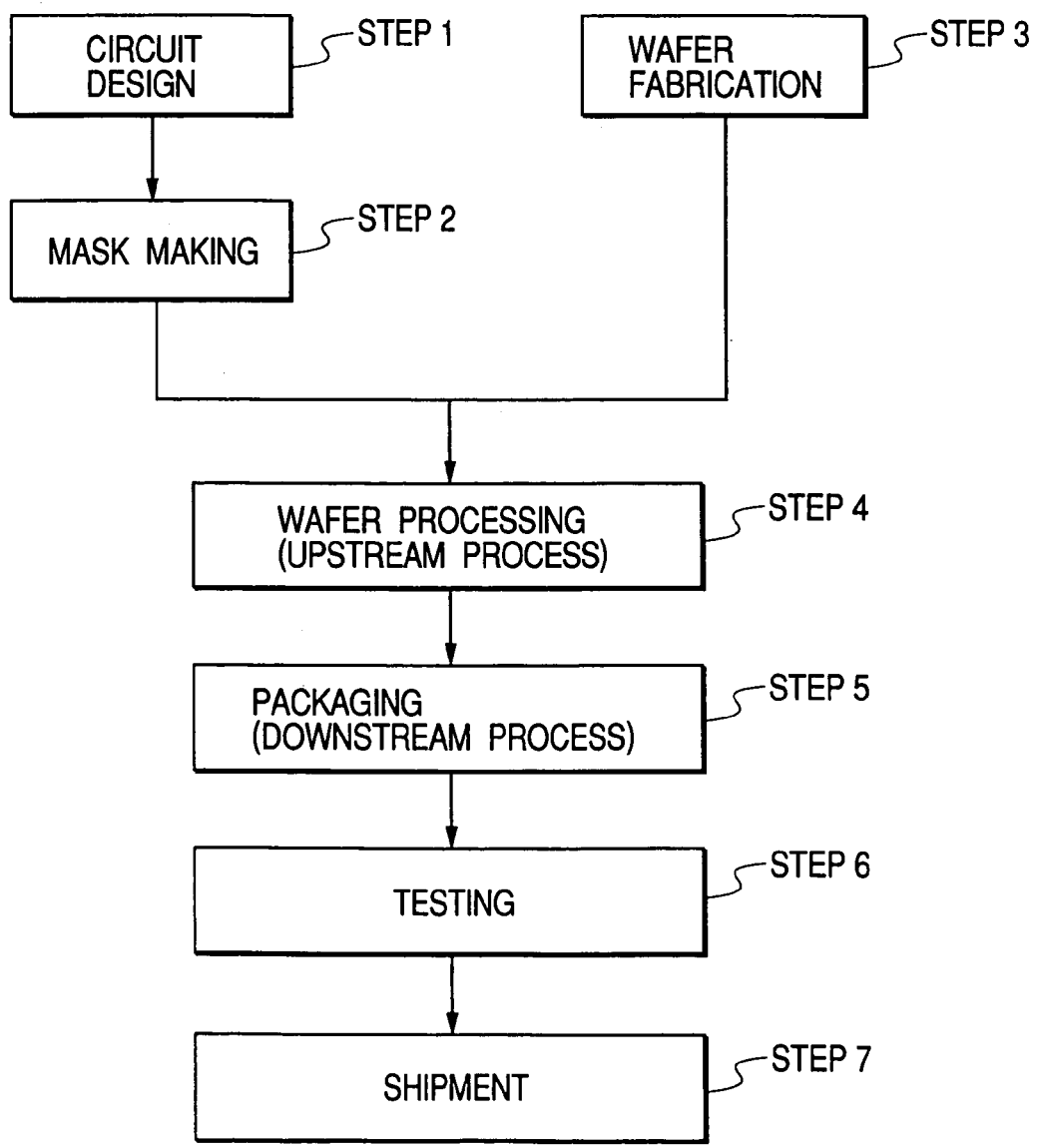
FIG. 11 is a flowchart for explaining a manufacturing flow of a device (such as a semiconductor chip such as an IC or an LSI, an LCD, or a CCD)

Next, an embodiment of a device manufacturing method using the above-mentioned exposure apparatus 100, 10A, or 100B will be described with reference to FIGS. 11 and 12. FIG. 11 is a flowchart for explaining a manufacturing flow of a device (such as a semiconductor chip such as an IC or an LSI, an LCD, or a CCD). Here, an example in which the semiconductor chip is manufactured will be described. In Step 1 (circuit design), a circuit design of the device is performed. In Step 2 (mask making), a mask on which the designed circuit pattern is formed is made. In Step 3 (wafer fabrication), a wafer is fabricated using a material such as silicon. Step 4 (wafer processing) is called an upstream process. In Step 4, an actual circuit is formed on the wafer using the mask and the wafer by a lithographic technique. Step 5 (packaging) is called a downstream process which is a process of producing a semiconductor chip using the wafer obtained in Step 4. Step 5 includes processes such as assembly process (dicing and bonding) and a packaging process (chip sealing). In Step 6 (testing), a test such as an operation check or a durability test is performed on a semiconductor device produced in Step 5. The semiconductor device is completed through the processes, followed by shipment thereof (Step 7).

Figure 12:
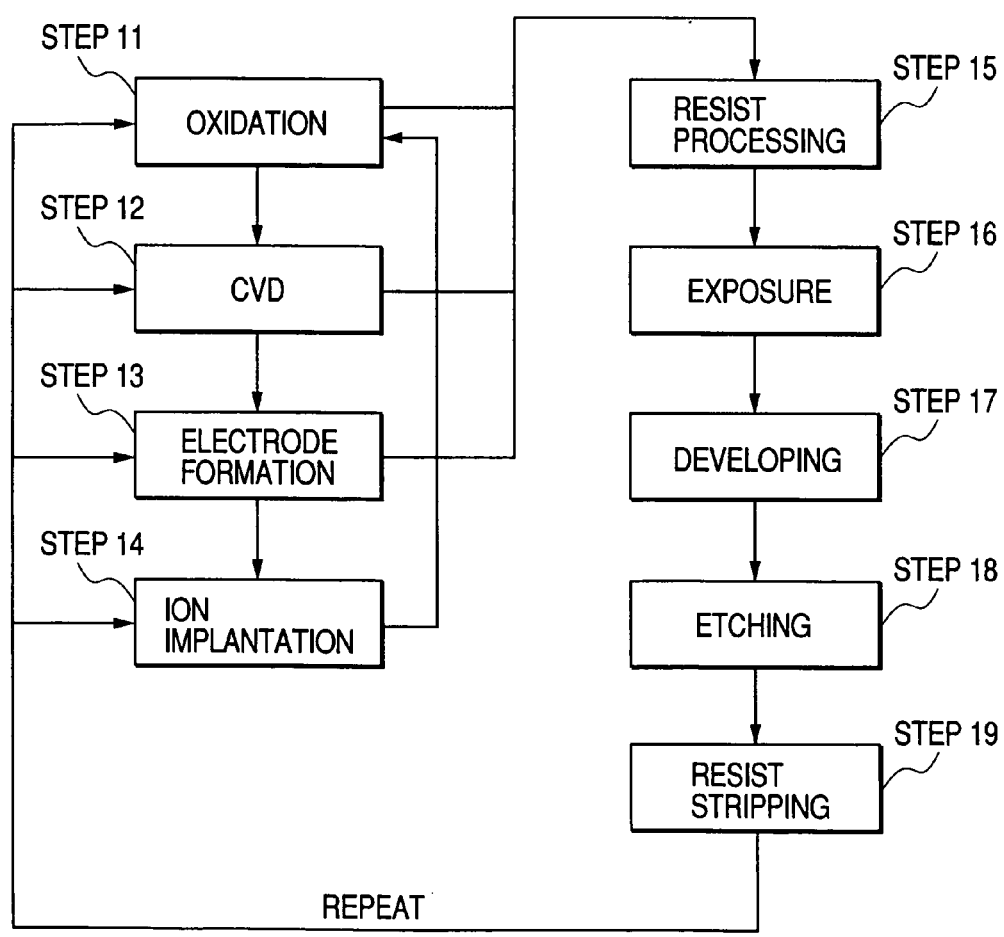
FIG. 12 is a flowchart for explaining a wafer processing in Step 4 shown in FIG. 11 in detail.

FIG. 12 is a flowchart for explaining the wafer processing in Step 4 in detail. In Step 11 (oxidation), the surface of the wafer is oxidized. In Step 12 (CVD), an insulating film is formed on the surface of the wafer. In Step 13 (electrode formation), an electrode is formed on the wafer by evaporation or the like. In Step 14 (ion implantation), ions are implanted into the wafer. In Step 15 (resist processing), a photosensitive agent is applied onto the wafer. In Step 16 (exposure), the circuit pattern of the mask is exposed to the wafer by the exposure apparatus 100, 10A, or 100B. In Step 17 (developing), the exposed wafer is developed. In Step 18 (etching), a region other than a developed resist image is removed. In Step 19 (resist stripping), an unnecessary resist left after etching is removed. These steps are repeated, so that a multiple circuit pattern is formed on the wafer. According to the device manufacturing method in this embodiment, a high-grade device can be manufactured as compared with a conventional device. Thus, the device manufacturing method using the exposure apparatus 100, 10A, or 100B and the resultant device provide an aspect of the present invention.

The preferred embodiments of the present invention have been described so far. It is needless to say that the present invention is not limited to the embodiments. Therefore, various modifications and changes can be made without departing from the spirit of the present invention.

What is claimed is:

1. An exposure method of exposing a pattern formed on a reticle to a substrate through a projection optical system while the reticle and the substrate are scanned in synchronous with each other, comprising:
   a measuring step of measuring a tilt of an image plane of the projection optical system in a direction in which the reticle and the substrate are scanned; and
   a correcting step of correcting the tilt of the image plane of the projection optical system based on measurement obtained by the measuring step,
   wherein, in the measuring step, the tilt of the image plane is measured by detecting a light through the projection optical system.

2. An exposure method according to claim 1, wherein a plurality of measurement positions in the measuring step are at least three positions which are not arranged on a straight line.

3. An exposure method according to claim 1, wherein the correcting step includes correction of a tilt of the image plane of the projection optical system in the scanning direction in accordance with the measurements obtained by the measuring step.

4. An exposure method according to claim 1, further comprising:
   a step of calculating a curvature of the image plane of the projection optical system from the measurements obtained by the measuring step.

5. An exposure method according to claim 1, wherein the correcting step includes adjustment of at least one of a position of the substrate and the projection optical system to reduce the tilt of the image plane of the projection optical system, which is caused from the predetermined pattern.

6. An exposure method according to claim 1, wherein the correcting step includes at least one of drive of an optical element included in the projection optical system in an optical axis direction of the projection optical system and decentering of the optical element about the optical axis direction of the projection optical system, and tilting of the optical element with respect to the optical axis direction of the projection optical system.

7. An exposure method according to claim 1, wherein at least one of the plurality of measurement positions are located outside an area which is irradiated with exposure light at a time of exposure.

8. An exposure method according to claim 7, wherein at least one of the plurality of measurement positions is located outside an area which is irradiated with the exposure light in the scanning direction.

9. An exposure apparatus for exposing a pattern formed on a reticle to a substrate through a projection optical system while the reticle and the substrate are scanned in synchronous with each other, comprising:
 a measuring mechanism for measuring a tilt of an image plane of the projection optical system in a direction in which the reticle and the substrate are scanned; and
 a correcting mechanism for correcting the tilt of the image plane of the projection optical system based on measurement obtained by the measuring mechanism wherein, in the measuring step, the tilt of the image plane is measured by detecting a light through the projection optical system.

10. A device manufacturing method, comprising:

a step of applying a photosensitive agent to a substrate;

an exposing step of exposing the substrate by the exposure method according to claim 1; and a developing step of developing the exposed substrate.

11. A device manufacturing method, comprising:

a step of applying a photosensitive agent to a substrate;

an exposing step of exposing the substrate by the exposure apparatus according to claim 9; and a developing step of developing the exposed substrate.

* * * * *